United States Patent
Wang et al.

(10) Patent No.: US 8,428,526 B2
(45) Date of Patent: Apr. 23, 2013

(54) SYSTEM AND METHOD FOR TUNING BASEBAND FILTERS IN WIRELESS TRANSCEIVERS

(75) Inventors: Yongtao Wang, Plano, TX (US); Khurram Muhammad, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1042 days.

(21) Appl. No.: 12/049,995

(22) Filed: Mar. 17, 2008

(65) Prior Publication Data
US 2009/0170445 A1 Jul. 2, 2009

Related U.S. Application Data

(60) Provisional application No. 61/017,379, filed on Dec. 28, 2007.

(51) Int. Cl.
*H04B 1/04* (2006.01)
*H04K 3/00* (2006.01)

(52) U.S. Cl.
USPC .......................................... 455/126; 455/306

(58) Field of Classification Search ............... 455/126, 455/226.1, 266, 306, 307; 375/240, 350
See application file for complete search history.

(56) References Cited

U.S. PATENT DOCUMENTS

| | | | |
|---|---|---|---|
| 6,914,437 B2 * | 7/2005 | Ibrahim et al. | 324/616 |
| 7,817,970 B2 * | 10/2010 | Puma | 455/114.3 |
| 2005/0123036 A1 * | 6/2005 | Rahman et al. | 375/240 |

* cited by examiner

*Primary Examiner* — Lee Nguyen
(74) *Attorney, Agent, or Firm* — Ronald O. Neerings; Wade James Brady, III; Frederick J. Telecky, Jr.

(57) ABSTRACT

A system and method for tuning baseband filters in wireless transceivers. A method comprises coupling a radio frequency (RF) signal generated by the wireless transmitter at an input of a wireless receiver, the RF signal having a desired frequency, measuring a magnitude of the coupled RF signal at an output of an analog-to-digital converter at an output of an analog baseband filter, wherein the magnitude is measured at the desired frequency, and adjusting a corner frequency of the analog baseband filter in response to the determining that the measured magnitude differs from a specified value.

33 Claims, 5 Drawing Sheets

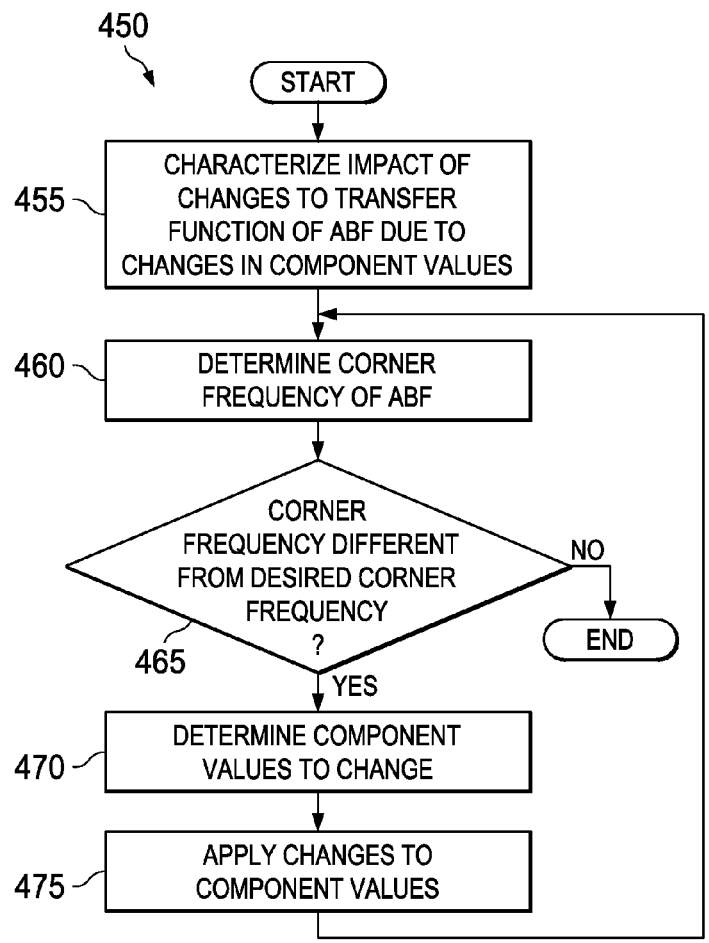
FIG. 4B
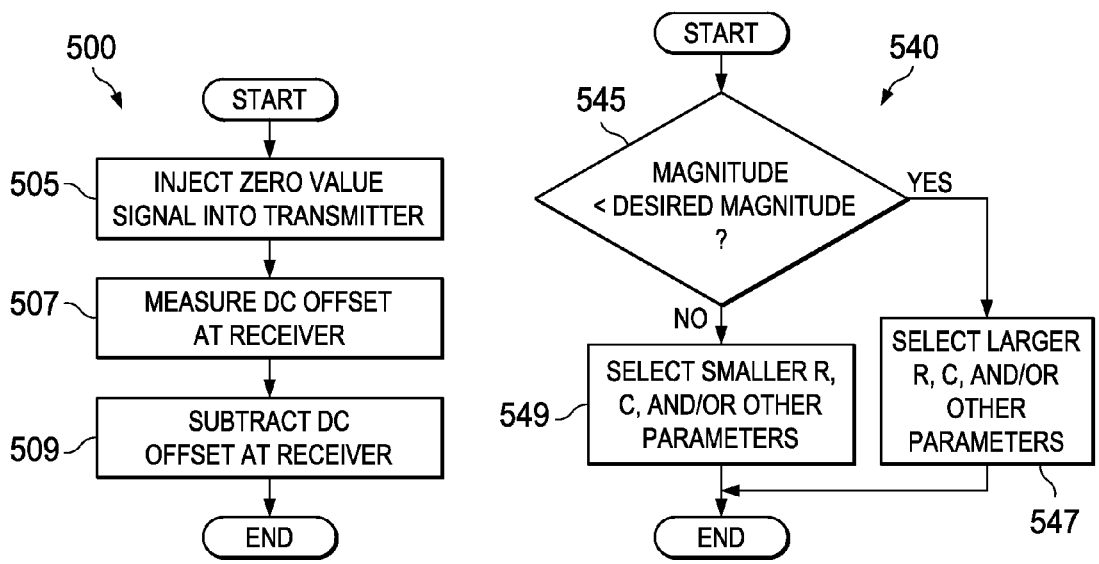
FIG. 5A
FIG. 5B

SYSTEM AND METHOD FOR TUNING BASEBAND FILTERS IN WIRELESS TRANSCEIVERS

This application claims the benefit of U.S. Provision Application No. 61/017,379, filed on Dec. 28, 2007, entitled "System and Method for Tuning Baseband Filters in Wireless Transceivers," which application is hereby incorporated herein by reference.

TECHNICAL FIELD

The present invention relates generally to a system and method for wireless communications, and more particularly to a system and method for tuning baseband filters in wireless transceivers.

BACKGROUND

A wireless communications device often has to operate in environments with a number of other electronic devices. Many of these electronic devices may generate interference that may negatively impact the performance of the wireless communications device. For example, interferers may compress the analog circuitry in a wireless receiver, or even saturate the analog-to-digital converter (ADC). The wireless communications device typically depends on the use of analog baseband filters (ABF) to achieve sufficient attenuation on the interferers. When operating properly, the analog baseband filters may eliminate or substantially attenuate the interferers and leave an intended signal relatively unaffected. Therefore, analog baseband filters with accurate frequency characteristics may be needed to ensure good performance of the wireless communications device.

However, an actual analog baseband filter's frequency characteristics (actual frequency characteristics), such as the analog baseband filter's cutoff frequency, passband attenuation, and so forth, may differ from a desired analog baseband filter's frequency characteristics (desired frequency characteristics). Differences between the desired frequency characteristics and the actual frequency characteristics may be the result of fabrication process variations, variations in electrical component values, changes in operating temperature, supply voltage drift, and so forth. As the differences between the desired frequency characteristics and the actual frequency characteristics increase, the analog baseband filters may not be able to provide sufficient filtering of interferers, resulting in too much of the interferer remaining in the analog baseband signal. Alternatively, the analog baseband filters may attenuate too much of the intended signal. In either case, the performance of the wireless communications device may suffer.

SUMMARY OF THE INVENTION

These and other problems are generally solved or circumvented, and technical advantages are generally achieved, by embodiments of a system and method for tuning baseband filters in wireless transceivers.

In accordance with an embodiment, a method for tuning a filter in a wireless receiver using a wireless transmitter co-located with the wireless receiver is provided. The method includes coupling a radio frequency (RF) signal generated by the wireless transmitter at an input of the wireless receiver, the RF signal having a desired frequency, measuring a magnitude of the coupled RF signal at an output of the filter, and adjusting a corner frequency of the filter in response to the determining that the measured magnitude differs from a specified value. The magnitude is measured at the desired frequency, and the adjusting is responsive to a difference between the magnitude and the specified value.

In accordance with another embodiment, a transceiver is provided. The transceiver includes a transmitter to generate and transmit radio frequency (RF) signals, and to generate an RF tuning signal having a desired frequency component, and a receiver co-located with the transmitter. The receiver having an analog baseband filter tunable by using a tuning RF signal parasitically coupled from the transmitter, the receiver to receive RF signals from over the air by an antenna.

In accordance with another embodiment, a method for tuning an analog baseband filter (ABF) having components in a wireless receiver using a wireless transmitter co-located with the wireless receiver is provided. The method includes characterizing an impact to a transfer function of the ABF due to changes in component values of the components in the ABF, producing characterization data, and determining a corner frequency of the ABF. The method also includes in response to a determining that the corner frequency differs from a desired corner frequency by more than a threshold, selecting component values to adjust using the characterizing data, and applying changes to the components in the ABF. The method additionally includes in response to a determining that the corner frequency does not differ from a desired corner frequency by more than a threshold, leaving the components in the ABF unchanged.

An advantage of an embodiment is that no additional hardware is needed to provide for the automatic frequency tuning of analog baseband filters to ensure that the proper filtering of interferers is achieved.

A further advantage of an embodiment is that additional hardware is not needed for tuning of an analog baseband filter. This may lead to simpler and less expensive wireless communications devices.

A further advantage of an embodiment is that the frequency tuning of analog baseband filters may occur automatically without external intervention.

The foregoing has outlined rather broadly the features and technical advantages of the present invention in order that the detailed description of the embodiments that follow may be better understood. Additional features and advantages of the embodiments will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the embodiments, and the advantages thereof, reference is now made to the following descriptions taken in conjunction with the accompanying drawings, in which:

FIG. 4b is a diagram of a sequence of events in the tuning of an analog baseband filter;

FIG. 5a is a diagram of a sequence of events in measuring and cancelling a DC offset in a receiver; and FIG. 5b is a diagram of a sequence of events in adjusting an analog baseband filter.

DETAILED DESCRIPTION OF ILLUSTRATIVE EMBODIMENTS

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The embodiments will be described in a specific context, namely a wireless transceiver to be used in a wireless communications device, such as a cellular telephone. The invention may also be applied, however, to other wireless transceivers used in other forms of wireless communications, such as wireless data communications, wireless multimedia communications, and so forth.

Figure 1A:
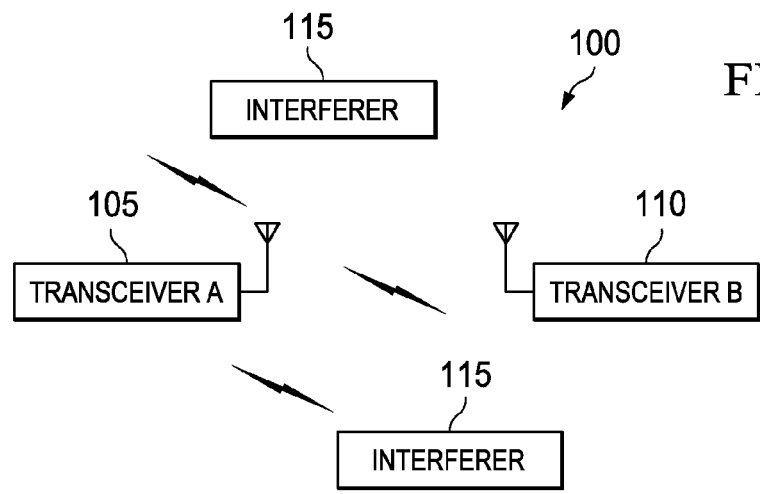
FIG. 1a is a diagram of a wireless communications system.

With reference now to FIG. 1a, there is shown a diagram illustrating a wireless communications system 100. The wireless communications system 100 includes a transceiver A 105 and a transceiver B 110. The wireless transceiver A 105 and the wireless transceiver B 110 may exchange information, such as data, voice, audio, video, telemetry, sensor data, and so forth, through wireless transmissions. In general, the wireless transmissions may occupy a portion of electromagnetic spectrum that may either be licensed to the wireless communications system 100 or open for use by electronic devices meeting a specified set of requirements.

In addition to the transmissions from the wireless transceiver A 105 and the wireless transceiver B 110, there may be transmissions from other wireless transceivers in the wireless communications system 100. Furthermore, there may be transmissions and/or emissions from other electronic devices that may be operating in close proximity to the wireless communications system 100. If these transmissions and/or emissions from other electronic devices occupy the same or an adjacent portion of the electronic spectrum as the transmissions from the wireless transceiver A 105 and the wireless transceiver B 110, then the transmissions and/or emissions may cause interference. FIG. 1a displays a number of interferers 115.

The interferers 115 may be other wireless transceivers operating in close proximity to the wireless communications system 100. The interferers may transmit without regard to their impact on other wireless communications systems. Alternatively, the interferers 115 may be electronic devices, such as electronic devices having large motors, microwave ovens, security systems, and so on, which may emit extraneous electromagnetic radiation.

Figure 1B:
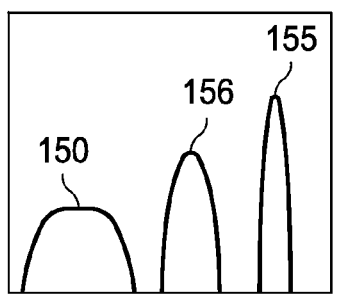
FIGS. 1b and 1c are plots of spectral usage for a wireless communications system, showing spectral usage of interferers.
Figure 1C:
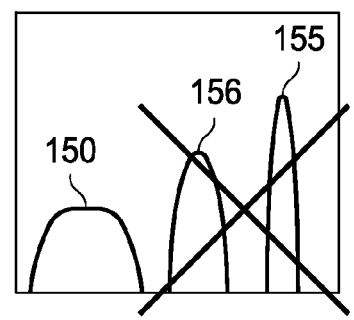

FIG. 1b displays a plot of spectral usage for the wireless communications system 100 and several interferers. The plot of spectral usage displays the spectral usage for the wireless communications system 100 as a first trace 150 and a several interferers as a second trace 155 and a third trace 156. Although the interferers (the second trace 155 and the third trace 156) may not directly encroach into the electromagnetic spectrum of the transmissions of the wireless communications system 100, their relative closeness may still negatively impact the transmission performance of the wireless communications system 100 nevertheless. Therefore, it may be desirable to attenuate or eliminate the interferers in the receiver of the wireless communications system 100. FIG. 1c displays a plot of spectral usage for the wireless communications system 100 with the interferers eliminated.

A common technique used to attenuate interferers is to use an analog baseband filter to filter out any signals in the electromagnetic spectrum outside of the portion of the electromagnetic spectrum used by the wireless communications system 100. The use of the analog baseband filter may require that transmissions received at a transceiver be down-converted to a baseband frequency prior to filtering, which is usually the case in modern wireless transceivers. Alternatively, the analog baseband filter may filter out signals in the electromagnetic spectrum outside of the portion of the electromagnetic spectrum occupied by a communications channel used by the wireless communications system 100 capable of receiving transmission over a number of communications channels. This may yield better performance in wireless communications systems that transmit using a communications channel that may be one of a number of communications channels being used by the wireless communications system.

Figure 2:
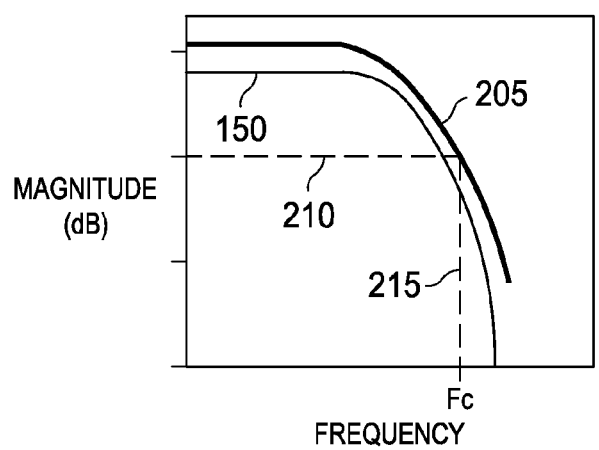
FIG. 2 is a plot of frequency response of an analog baseband filter.

FIG. 2 illustrates a plot of a frequency response of an analog baseband filter, shown as curve 205. FIG. 2 also illustrates the first trace 150 to display the spectral usage of the wireless communications system 100. As shown in FIG. 2, the analog baseband filter may be a low pass filter, meaning that the analog baseband filter will pass signals with frequency components below its corner frequency (Fc) while attenuating signals with frequency components above its corner frequency. An analog baseband filter's corner frequency (Fc) may be defined as a frequency wherein a signal at the frequency receives 3 dB more attenuation than the signal at direct current (DC). That is, if a DC signal and a signal at corner frequency Fc with the same amplitude pass through the analog baseband filter, amplitude of the signal at Fc will be attenuated by an amount substantially equal to $$\frac{1}{\sqrt{2}}$$

of that of the output DC signal. This relationship may be employed to determine the corner frequency of an analog baseband filter. As shown in FIG. 2, the 3 dB point (shown as line 210) occurs at frequency Fc (shown as line 215).

An analog baseband filter's corner frequency may be a function of the values of electrical components, such as resistors (R) and capacitors (C), in the analog baseband filter or other implementation specific parameters, such as a capacitance ratio of two capacitors, for example. By adjusting the values of the resistors, capacitors, and/or other related parameters, it may be possible to tune the corner frequency of the analog baseband filter. For example, for a single pole low-pass filter, the corner frequency may be proportional to $$\frac{1}{RC}.$$

Therefore, to increase the corner frequency, either the values of the resistors or the capacitors or both may be decreased. Similarly, to decrease the corner frequency, either the values of the resistors or the capacitors or both may be increased.

Figure 3A:
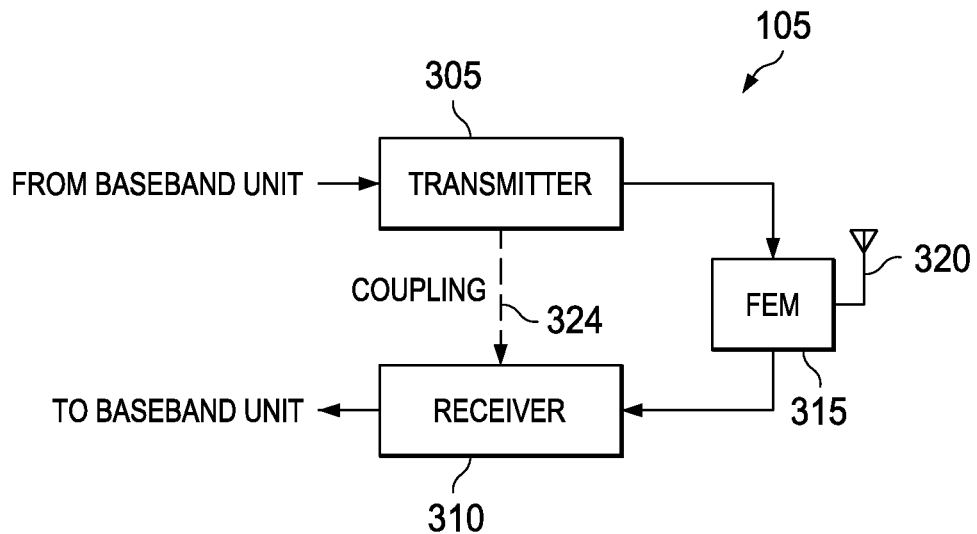
FIG. 3a through 3c are diagrams of transceivers.

FIG. 3a illustrates a high-level view of a portion of the wireless transceiver A 105. The wireless transceiver A 105 includes a transmitter 305, a receiver 310, a front-end module (FEM) 315, and an antenna 320. The FEM may include a power amplifier, antenna switches, duplexer, diplexer, SAW filters, and so forth. The transmitter 305 may be used to provide signal processing necessary to transmit information from a baseband unit over the air using the antenna 320, while the receiver may be used to provide signal processing to provide information received over the air via the antenna 320 to the baseband unit.

Generally, in a transmitter (TX), a digital signal from a digital baseband unit may be processed (for example, filtering, digital-to-analog conversion, etc.) and then modulated onto an RF carrier signal. The RF signal containing the modulated digital signal may then be amplified and radiated through an antenna. This modulation (or up-conversion) in a transmitter may require the use of a local oscillator (LO) or an RF frequency synthesizer (for example, a phase-locked loop). Phase modulation may also be performed at the LO when a polar architecture is adopted for the transmitter. Generally, in a receiver (RX), a received RF signal may be amplified by a low-noise amplifier (LNA) and then down-converted by mixers to an analog baseband signal. There may also be filters between the LNA and the mixers. The analog baseband signal may then be filtered by analog baseband filters and may be further amplified. The baseband signal may then be digitized by an ADC. The down-conversion in the mixers generally requires the use of a local oscillator (LO). The transmitter and the receiver may share a common LO or have separate transmit (TX) LO and receive (RX) LO.

When implemented on a single integrated circuit or separate integrated circuits and placed in close proximity, there may be signal coupling between the transmitter 305 and the receiver 310, wherein a signal transmitted by the transmitter 305 may also appear at an input to the receiver 310. The coupling between the transmitter 305 and the receiver 310 (shown as dashed line 324) may be utilized to allow tuning of analog baseband filters located in the receiver 310 to help ensure that the analog baseband filters are operating at or near desired frequency characteristics so that sufficient filtering of interferers occur without too much attenuation of the baseband signal.

Figure 3C:
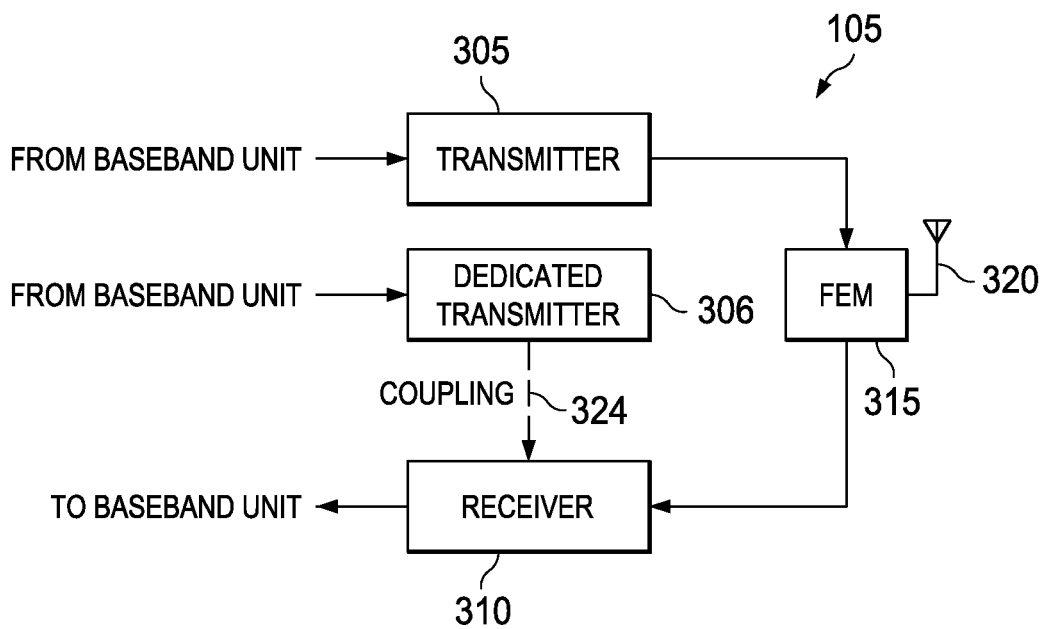
Figure 3B:
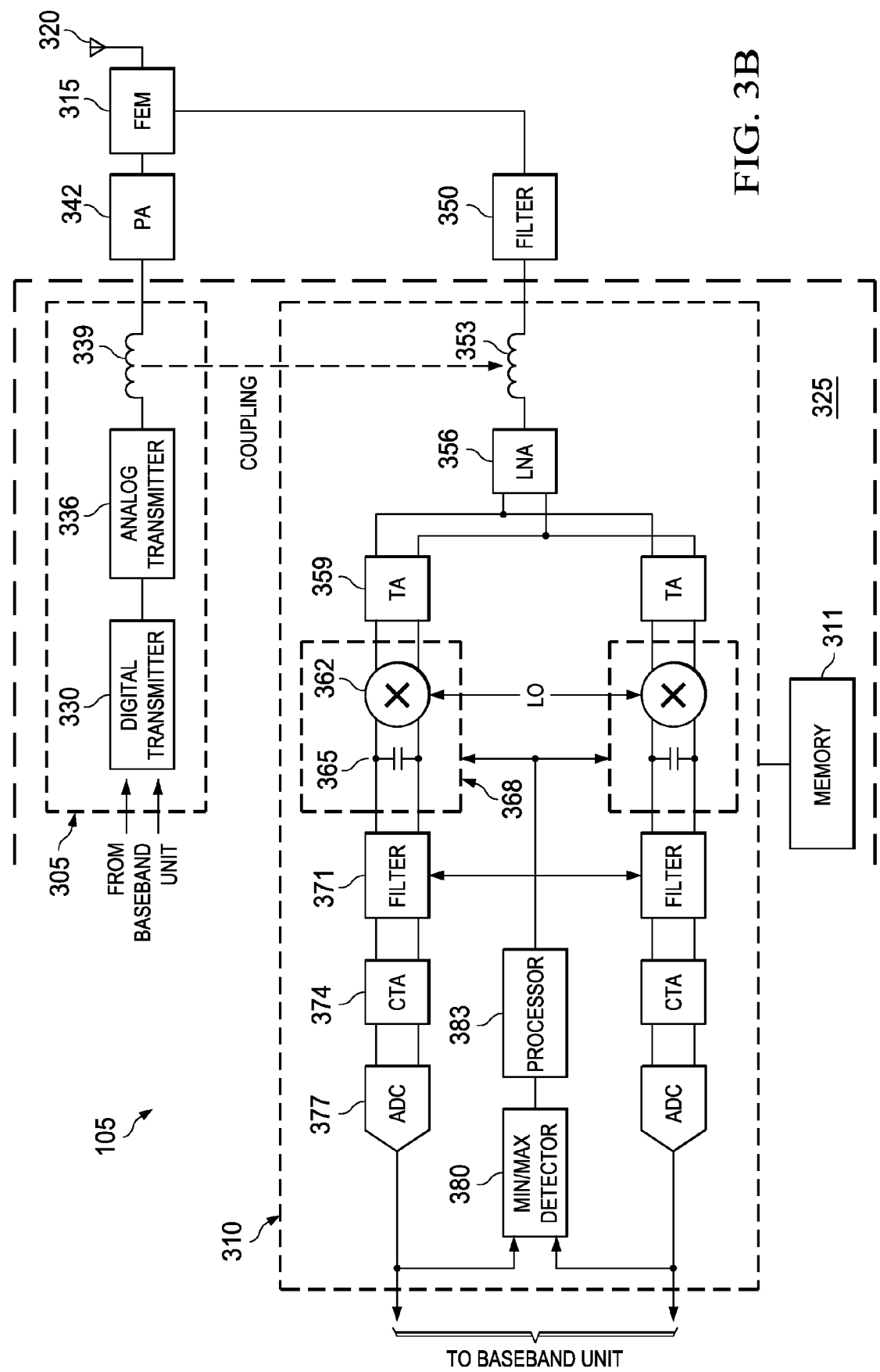

FIG. 3b illustrates a detailed view of a portion of the wireless transceiver A 105. The figure shown in FIG. 3b illustrates one possible embodiment of the wireless transceiver A 105. Other embodiments are possible. Therefore, the discussion of the wireless transceiver A 105 as shown should not be construed as being limiting to either the spirit or the scope of the present invention.

The wireless transceiver A 105 may include a radio integrated circuit (radio IC) 325. The radio IC 325 may include integrated versions of the transmitter 305 and the receiver 310 as well as additional circuitry that may be used to ensure the proper operation of the wireless transceiver A 105. The wireless transceiver A 105 may also include components not part of the radio IC 325, such as the antenna 320 and the diplexer 315, as well as circuitry needed for proper operation of the wireless transceiver A 105.

The digital portion of the transmitter 305 forms a digital transmitter 330 which may perform digital signal processing such as filtering, upsampling, etc. An analog/RF portion of the transmitter 305 forms an analog transmitter 336. In a Cartesian transmitter architecture, the analog transmitter 336 may perform digital-to-analog conversion of digital I and Q signals, low-pass filtering, up-conversion by mixing I and Q signals with a TX LO signal, amplification, etc. In a polar transmitter architecture, the analog transmitter 336 may perform phase modulation in the transmit LO, combine amplitude and phase signals to construct a composite RF signal, amplification, and so forth. There are various ways of implementing the digital transmitter 330 and the analog transmitter 336. The output RF signal of the analog transmitter 336 may pass through a trace 339, which may be located in the package of IC 325. The output RF signal may be amplified by a power amplifier 342 and radiated through an antenna 320. FEM 315 may be used for switching between transmit and receive.

The receiver 310 illustrates an exemplary implementation of a wireless receiver. The receiver 310 of the wireless transceiver A 105 receives a radio frequency (RF) signal transmitted over the air and detected by the antenna 320. The RF signal at antenna 320 may first be filtered by a filter 350 to attenuate far-out noises and interferers. The filter 350 may preferably be an RF band-pass filter. The filter 350 may be a surface acoustic wave (SAW) filter. SAW filters are well known by those of ordinary skill in the art and will not be discussed herein. After the filter 350, the received RF signal may actually be provided to the receiver 310, which may be in the radio IC 325. The received RF signal may be provided to the receiver 310 via signal traces 353 and then to a low noise amplifier (LNA) 356. The LNA 356 may be used to amplify the received RF signal to a level compatible with circuitry in the receiver 310. The remainder of the receiver 310 as shown in FIG. 3b may described as a receiver using quadrature demodulation. However, alternate embodiments of the receiver 310 without quadrature demodulation are possible with minor modifications to the receiver 310 as shown. Therefore, the illustration of a quadrature demodulation receiver should not be construed as being limiting to either the scope or the spirit of the present invention. The discussion of the receiver 310 will follow one of the two signal paths arising from the use of quadrature demodulation. The two signal paths are substantially identical and the discussion of a first signal path of the two signal paths will also apply to a second signal path.

The received RF signal may pass through a low-noise amplifier (LNA) 356 and a trans-conductance amplifier 359, and may then be down-converted by mixer 362 to an analog baseband signal. The output of the mixer 362 is connected to a capacitor 365. The capacitor 365 and the mixer 362 may form a first-order low-pass filter 368, which may provide filtering of the down-converted analog baseband signal. Part of the filter 368 is in the RF domain since the mixer 362 is part of the filter 368. As such, the injection of an RF signal into mixer 362 may be necessary for characterizing and the tuning of the corner frequency of filter 368.

After filtering by the first order low pass filter 368, additional filtering may be provided by a filter 371. The filter 371 may be a switched capacitor filter. The use of a switched capacitor filter may enable a tunable filter that does not require the use of resistors, which may simplify fabrication of the radio IC 325. The filter 371 may enable higher order filtering, which may allow for greater attenuation of interferers, especially on close-in interferers, than a first-order filter. Output of filter 371 may then be amplified, with additional amplification provided by a continuous-time amplifier (CTA) 374. Output of CTA 374 may be digitized by ADC 377. The digitized baseband signal may then be provided to the baseband unit for further processing, such as extracting the information contained in the baseband signal.

In general, a min/max detector (MIN/MAX DETECTOR) 380 detects the minimum and maximum of a signal at its input (the digitized baseband signal) over a period of time. The operation of the min/max detector 380 may be controlled by a processor 383. The processor 383 may control when to start and end the min/max detection, for example. The resultant minimum (MIN) and maximum (MAX) values may be read into the processor 383 for further processing. For example, the processor 383 may compute an amplitude of the input signal of the min/max detector as (MAX−MIN)/2. The capability of measuring and computing the amplitude of a digital signal at the receiver 310 may be useful for tuning the analog baseband filters.

Some parameters of filter 371 and 368 (for example, capacitance of capacitor 365, R or C or other parameters of filter 371) may also be configurable by the processor 383. As discussed previously, an analog baseband filter's corner frequency may be defined as a frequency wherein a signal is attenuated by an amount about equal to $$\frac{1}{\sqrt{2}}$$

of the value of the signal in the analog baseband filter's passband. In dB, the signal at the corner frequency is about 3 dB lower than the passband value of the signal. The minimum/maximum detector 380 may be used to detect the baseband signal's magnitude to determine if the desired magnitude is achieved. For example, the minimum/maximum detector 380 may compare the baseband signal's magnitude with a value substantially equal to $$\frac{1}{\sqrt{2}}$$

times the passband value of the signal. Alternatively, a comparator may be used in place of the minimum/maximum detector 380. The comparator would compare the baseband signal's magnitude and a value substantially equal to $$\frac{1}{\sqrt{2}}$$

times the passband value of the signal. The minimum/maximum detector 380 may provide information related to the baseband signal's magnitude to the processor 383, which may provide appropriately selected control words to adjust the capacitance, resistance, and/or some other parameter of the first-order low pass filter 368 and the filter 371 to tune the corner frequency of the analog baseband filter. For example, a capacitor control word may be used to adjust the capacitance of a capacitor in the filter 368 and/or the filter 371, thereby changing its corner frequency. By varying these parameters, the corner frequencies of filter 371 and/or the filter 368 may be tuned.

For more complex analog baseband filters, their frequency domain transfer function may be evaluated as a function of component values (R, C, and so forth) used to build the analog baseband filter. Each of these components may be designed to be software programmable to enable tuning. For example, let an implementation of an analog baseband filter include two resistors, R1 and R2, and two capacitors, C1 and C2. The transfer function of the analog baseband filter may be expressible as H(f)=f(R1, R2, C1, C2), i.e., the transfer function of the analog baseband filter may be a function of the components used in the analog baseband filter.

After characterization, the values of R1, R2, C1, and C2 may be fixed to obtain a desired transfer function. However, component values may change with change in temperature, and the transfer function of the analog baseband filter may change value at various offset frequencies. The corner frequency of the analog baseband filter may be tuned back if the transfer function of the analog baseband filter may be measured at two or three points. For example, tones at desired offset frequencies used in the transmitter 305 may be injected into the transmitter 305 and coupled to the analog baseband filter. A peak-to-peak voltage swing at the output of the receiver 310 (the output of the ADC 377) may be measured to determine frequency response at the desired offset frequencies.

With the peak-to-peak voltage swing measured for the desired offset frequencies, it may be possible to determine which component (R1, R2, C1, or C2) to change and in which direction (increase or decrease) to shift the corner frequency. An iterative approach that repeats the measuring and the adjusting may reprogram the transfer function of the analog baseband filter to a desired corner frequency by choosing the values of R1, R2, C1, and C2 that may provide the analog baseband filter with the desired corner frequency. For example, if the corner frequency of the analog baseband filter is higher than desired, then component values may be changed to reduce the corner frequency of the analog baseband filter. Similarly, if the corner frequency of the analog baseband filter is lower than desired, then component values may be changed to increase the corner frequency of the analog baseband filter. The iterative approach may be repeated periodically or on occasion to ensure that analog baseband filter of the receiver 310 remains properly tuned to the desired corner frequency.

Alternatively, characterized data may be stored in a memory 311 (or a table in the memory 311), such as a lookup table, that provides the impact of changes in the values of the components in the analog baseband filter as a function of temperature. Then, as the temperature changes, the characterized data may be referenced to determine new values for the components, such as R1, R2, C1, and C2, that may be used to obtain the desired corner frequency. For example, if the value of R1 increases by 2% over temperature, R2 increases by 5% over temperature, C1 increases by 2% over temperature, C2 increases by 4% over temperature, and the temperature increases by X degrees Celsius, then new values of R1, R2, C1, and C2 may be computed to maintain the desired corner frequency. After changing the values of the components, the transfer function of the analog baseband filter may be measured again to verify the corner frequency of the analog baseband filter is at the desired corner frequency or to further improve the tuning of the corner frequency.

The measurements of the transfer function of the analog baseband filter may be made using the techniques described above or by using a one-point Fast Fourier Transform (FFT) or a two-point FFT. A commonly used method for implementing a one-point FFT is Goertzel's algorithm. There may be other widely known methods for implementing one-point FFTs.

In general, the wireless transceiver A 105 may be configured by executing appropriate scripts on the processor 383. For example, digital inputs of the transmitter 305 may be programmed through the processor 383. Furthermore, the TX LO and RX LO may be configured by the processor 383 to generate waveforms at desired RF frequency. Additionally, the gain of the amplifiers in the transmitter 305 may be adjusted by the processor 383 so that power of the analog transmitter 336 output meets given requirements. The gain of the amplifiers in the receiver 310 (such as the LNA 356, the TA 359, and the CTA 374) may also be adjusted by the processor 383 to ensure that the received signal at the output of ADC 377 has a high signal-to-noise ratio (SNR).

In addition to receiving RF signals via the antenna 320, the receiver 310 may also receive RF signals from the transmitter 305 through a coupling that may be present between the signal traces 339 and the signal traces 353. The coupling may be parasitic coupling between the existing traces or bond wires in a package or coupling between dedicated traces on package/IC substrate. In general, coupling is greater when the signal traces are closer together. When the transmitter 305 and the receiver 310 are integrated onto a single integrated circuit, the amount of coupling may be strong enough to be utilized for tuning of the analog baseband filters.

The coupling between traces 339 and trace 353 may be used to introduce an RF signal at the input of the receiver 310, where, in general, it may be difficult or expensive to generate an RF signal. Typically, intermediate frequency (IF) signals are easier and cheaper to internally generate than RF signals. However, IF signals may not accurately characterize the performance characteristics of components having an RF input (for example, the LNA 356, the mixer 362, the filter 368, and so forth). In general, components with performance characteristics that may change as a function of frequency may not be as accurately characterized with IF signals then as with RF signals. Therefore, the RF signals, at the input of the receiver 310, received from the transmitter 305 through coupling may be used in the tuning of the analog baseband filters.

Rather than using a transmitter, such as the transmitter 305, which in a transceiver that supports full-duplex operation, may never be available to help tune the analog baseband filters of a receiver, such as the receiver 310, a dedicated transmitter may be used. The dedicated transmitter may be driven by the receiver's local oscillator (RX LO) and may be used for generating tones at an offset from the receiver's RF carrier frequency. The injection of two tones and a DC signal at an input of the dedicated transmitter may produce an RF carrier and two tones at the same offset to the RF carrier. These signals may then be used to measure the transfer function of the analog baseband filter at three distinct points: DC, a first offset frequency, and a second offset frequency. FIG. 3c illustrates the wireless transceiver A 105 having a dedicated transmitter 306 for use in tuning the analog baseband filters of the receiver 310.

Figure 4A:
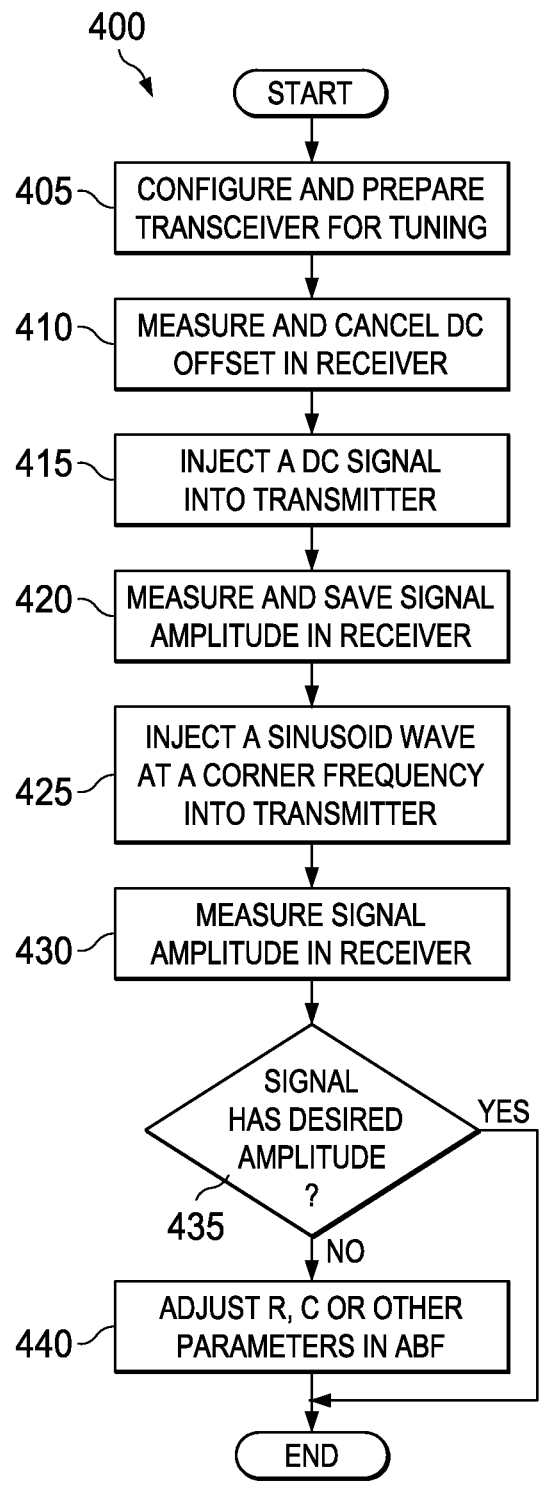
FIG. 4a is a diagram of a sequence of events in the tuning of an analog baseband filter.

FIG. 4a illustrates a sequence of events 400 in the tuning of analog baseband filters in a wireless transceiver, such as the wireless transceiver A 105, using coupling, such as parasitic coupling, of signals. The tuning of analog baseband filters may occur during a manufacture or testing of the wireless transceiver A 105, during an initial powering on or configuration of the wireless transceiver A 105, at regular intervals during normal operation of the wireless transceiver A 105, at the occurrence of an event (such as, at the initiation of a wireless connection, at the initiation of a voice call, at the termination of a wireless connection, at the termination of a voice call, during power on, prior to power off, or so on), or so forth. The tuning of the analog baseband filters may be controlled by a processor contained in the wireless transceiver A 105. The processor may be a general purpose processor used in the wireless transceiver A 105 to provide computational power or the processor may be a special purpose processor dedicated to the tuning of the analog baseband filters, such as a specially designed script processor.

If the wireless transceiver A 105 includes more than one analog baseband filter, such as the first order low pass filter 368 and the filter 371, then the tuning of the analog baseband filters may take place sequentially. For example, on a first tuning, all analog baseband filters except for one may be bypassed or deactivated by setting their corner frequencies to the maximum possible value to practically remove filtering, and the one analog baseband filter not bypassed or deactivated may be tuned to its desired corner frequency. The settings for the analog baseband filter not bypassed or deactivated may have its settings saved. Then on a second tuning, the analog baseband filter tuned in the first tuning may be bypassed or deactivated and one of the untuned and previously bypassed or deactivated analog baseband filters may be tuned and its settings saved. This may continue until all of the analog baseband filters have been tuned.

The discussion of the tuning of the analog baseband filters provided below will focus on low-pass analog baseband filters. A low-pass analog baseband filter will pass signals having frequency components below its corner frequency while attenuating signals having frequency components above its corner frequency. Other types of analog baseband filters may include band-pass analog baseband filters and high-pass analog baseband filters, as well as analog baseband filters that are combinations of the different types of analog baseband filters. The tuning of these other types of analog baseband filters may follow similar steps as described below. Therefore, the discussion of low-pass analog baseband filters should not be construed as being limiting to either the scope or the spirit of the embodiments.

The tuning of the analog baseband filters may begin with configuring and preparing a transceiver, such as the wireless transceiver A 105 for tuning (block 405). The configuring and preparing of the wireless transceiver A 105 may include configuring both a transmitter, such as the transmitter 305, and a receiver, such as the receiver 3 10. The configuring of the transmitter 305 and the receiver 310 may be performed by a processor, such as the processor 383. The configuring may include adjusting the transmit LO and the receive LO. Output frequency of the transmit LO and the receive LO (i.e., LO frequency ($F_{LO}$)) should be substantially the same if the transmitter 305 and the receiver 310 do not share a common LO, for example. Additionally, the transmitter's transmission chain should be properly set up to ensure that the receiver 310 will receive a strong RF signal coupled from the output of the analog transmitter 336. Furthermore, the receiver's receive chain should be properly set up to ensure a good SNR at the output of the ADC 377.

After configuring and preparing the wireless transceiver A 105, any DC offset that may be present in the signal path in the receiver 310 of the wireless transceiver A 105 may be measured and canceled (block 410). The measuring and cancelling of the DC offset may help to prevent erroneous measurements. For example, if the receiver 310 has a DC offset that is not cancelled, it may introduce an error in measurements of signal amplitudes in the receiver. The removal of the DC offset in the receiver 310 may also be important for avoiding degradation of receiver performance due to sub-optimum performance of the analog baseband filter in the receiver 310 since the value substantially equal to $$\frac{1}{\sqrt{2}}$$

times the passband value of the signal may occur at a higher or lower frequency due to the addition of the DC offset, thereby resulting in an incorrect corner frequency for the analog baseband filter.

Turning now to FIG. 5a, there is shown a diagram illustrating a sequence of events 500 for use in the measuring and cancelling of a DC offset in the receiver 310. The sequence of events 500 illustrates an embodiment of the measuring and cancelling of the DC offset (block 410). Other variations are possible and the sequence of events 500 should not be construed as being limiting to either the scope or the spirit of the embodiments. The measuring and cancelling of the DC offset may begin with the injection of a zero signal at the transmitter 305 (block 505). A zero signal may be a signal having a zero signal magnitude at zero frequency. The zero signal may then pass through the digital transmitter 330 and the analog transmitter 336. In an ideal case, there should be no signal coming out of the analog transmitter 336. In practice, there may be a very small RF signal at the LO frequency. This signal may then be coupled (for example, through parasitic coupling) to the receiver 310 by way of the signal traces 339 and the signal traces 353.

As the signal passes through the receiver 310, the signal becomes a DC offset after down-conversion at the mixer 362. The DC offset from the signal may combine with any DC offset introduced by the receiver 310. The combination of the DC offset from the signal and any DC offset introduced by the receiver 310 may be realized at the output of the ADC 377. Magnitude of this DC offset may be measured through the use of the minimum/maximum detector 380 and the processor 383 (block 507). The measured DC offset may then be used to subtract the DC offset from signals in the receiver 310 (block 509), for example, by applying an appropriate digital input to a DAC dedicated for DC offset cancellation in the receiver 310.

Turning back to FIG. 4a, after measuring and cancelling the DC offset that may be present in the receiver 310, the tuning of the analog baseband filters may continue with a measurement of a reference value (blocks 415 and 420). The reference value may be used in comparisons performed later in the tuning of the analog baseband filters. The measurement of the reference value may begin with the injection of a DC signal into the transmitter 305 (block 415). The DC signal should have an amplitude large enough so that the receiver 310 will receive an adequately large RF signal, but not too large to avoid saturating the receiver 310. The DC signal will result in an RF signal with LO frequency at the output of the analog transmitter 363, which may then be coupled into the receiver 310. The coupled RF signal may manifest as a DC signal at the output of the ADC 377. Amplitude of the coupled RF signal is then measured through the use of the minimum/maximum detector 380 and the processor 383 (block 420). As mentioned previously, the amplitude of the coupled signal may computed as (MAX−MIN)/2 in the processor 383. The amplitude of the coupled signal may then be saved as a reference value.

The tuning of the analog baseband filters may continue with injecting a sinusoidal wave at a desired corner frequency (Fc) of the analog baseband filter under tuning (block 425). The sinusoidal wave may be generated by the processor 383. Amplitude of the sinusoidal wave should the same as the magnitude of the DC signal used in the measurement of the reference value (blocks 415 and 420). The sinusoidal wave passes through the digital transmitter 330 and the analog transmitter 336. At the output of the analog transmitter 336, there may be an RF signal located at frequency Fc above the LO frequency, which may then be coupled into the receiver 310 and processed by components in the receiver 310. At the output of the ADC 377, there will be a sinusoidal wave of frequency Fc. Its amplitude may then be measured through the use of the minimum/maximum detector 380 and the processor 383 (block 430).

The measured amplitude is then compared with its desired amplitude, which is about $$\frac{1}{\sqrt{2}}$$

times the reference value measured in block 420 (block 435). The comparison between the measured amplitude and the desired amplitude may be made in the processor 383. If the measured amplitude equals the desired amplitude or is within a small range around the desired amplitude (i.e., their difference should not be greater than a specified threshold), then the analog baseband filter has the desired corner frequency and the tuning may be ended. Otherwise, R, C, and/or other parameters of the analog baseband filter may need to be adjusted so that the difference between the measured amplitude and the desired amplitude is smaller (block 440). For example, the corner frequency is $$\frac{1}{RC}$$

for a simple RC low-pass filter. If the measured amplitude is greater than the desired amplitude, meaning that the corner frequency is too large and needs to be reduced to move it closer to the desired corner frequency, then the value of R, C, and/or other parameters, may be increased. If the measured amplitude is smaller than the desired amplitude, meaning that the corner frequency is too small and needs to be increased to move it closer to the desired corner frequency, then the value of R, C, and/or other parameters, may be decreased.

FIG. 5b illustrates a sequence of events 540 in the adjustment of the values of R, C, and/or other parameters to tune the corner frequency of the analog baseband filter. The sequence of events 540 illustrates an embodiment in the adjustment of the values of R, C, and/or other parameters to tune the corner frequency of the analog baseband filter. Other variations are possible and the sequence of events 540 should not be construed as being limiting to either the scope or the spirit of the embodiments.

After the magnitude of the desired RF signal has been determined as not having the desired magnitude in block 435 (FIG. 4a), then it may be necessary to determine if the magnitude of the desired RF signal is less than the desired magnitude or greater than the desired magnitude. The relation of the magnitude of the desired RF signal to the desired magnitude may have an impact on the tuning of the analog baseband filters.

A comparison may be made to determine if the magnitude of the desired RF signal is less than the desired magnitude (block 545). If the magnitude of the desired RF signal is less than the desired magnitude, then the corner frequency of the analog baseband filters as currently configured is higher than the desired corner frequency, and the corner frequency of the analog baseband filters may be adjusted by selecting larger values for resistors, capacitors, and/or other parameters in the analog baseband filters (block 547). Since the corner frequency of a first order analog baseband filter may be proportional to 1/RC, increasing the value of the resistors, capacitors, or both, may decrease the value of 1/RC and move the corner frequency down to a lower frequency.

The values of the resistors, capacitors, or both may be altered by having the processor provide a control word, such as a resistor control word, or a capacitor control word, to the analog baseband filters. Alternately, the values of the resistors, capacitors, and other adjustable parameters may be altered by control signals adjustable through the processor. Alternatively, the processor may be able to directly switch the resistor, capacitor, or both in the analog baseband filter through the use of control signals that it may provide to the analog baseband filter.

If the magnitude of the desired RF signal is not less than the desired magnitude, then the magnitude of the desired RF signal is greater than the desired magnitude. This means that the corner frequency of the analog baseband filters as currently configured is lower than the desired corner frequency, and the corner frequency of the analog baseband filters may be adjusted by selecting smaller values for resistors, capacitors, or both in the analog baseband filters (block 549). Through the use of control words or control signals, the processor may alter the value of the resistors, capacitors, and/or other parameters to move the corner frequency in the direction desired.

Turning back now to FIG. 4*a*, after adjusting R, C, and/or other parameters of the analog baseband filter (block 425), after waiting a period of time to allow for settling, the amplitude of the signal at the output of the ADC 377 may be measured again in block 430, which may then be again compared with the desired amplitude in block 435. This may continue until the measured amplitude is equal to or within a small range around the desired amplitude.

The tuning of the analog baseband filters may be a search to find the proper values of the resistors, capacitors, and/or other parameters that result in the analog baseband filter having the desired corner frequency. Efficient search techniques, such as a binary search, may be implemented with a sorted set of control words or control signals to facilitate a more rapid search. Binary searches are considered to be well known by those of ordinary skill in the art and will not be discussed further herein.

FIG. 4*b* illustrates a sequence of events 450 in the tuning of analog baseband filters in a wireless transceiver, such as the wireless transceiver A 105, using coupling, such as parasitic coupling, of signals. The sequence of events 450 may be used when the wireless transceiver has a relatively complex analog baseband filter, an analog baseband filter having a large number of components, a number of cascaded analog baseband filters, or so on.

The tuning of the analog baseband filters may begin with a characterization of the impact of changes in component values of components in the analog baseband filter on the transfer function of the analog baseband filter (block 455). The characterization may be performed during a manufacture of the wireless transceiver, during a testing/configuration of the wireless transceiver, during an initial power up of the wireless transceiver, or so forth, and saved in a memory, such as the memory 311. The characterization may also take into consideration operating temperature.

Then, during normal operation of the wireless transceiver, the corner frequency of the analog baseband filter may be determined (block 460). The determination of the corner frequency of the analog baseband filter may be determined using any of the techniques described previously, including injecting signals of known magnitude and frequencies and then measuring a corresponding output signal at a receiver of the wireless transceiver. With the corner frequency determined, the corner frequency may be compared against a desired corner frequency (block 465). If the corner frequency is different from the desired corner frequency by more than a threshold, for example, then the characterization information save in the memory 311 may be used to determine which component(s) values are to be changed and by how much (block 470). The component(s) may then be changed (block 475). If the corner frequency is not different from the desired corner frequency by more than the threshold, then the tuning of the analog baseband filters may be complete and terminate.

Although the embodiments and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for tuning an analog baseband filter in a wireless receiver using a wireless transmitter co-located with the wireless receiver, the wireless receiver having an analog-to-digital (ADC) at an output of the analog baseband filter, the method comprising:
coupling a first radio frequency (RF) signal generated by the wireless transmitter at an input of the wireless receiver, the first radio frequency (RF) signal having a desired frequency;
measuring a reference value, comprising;
injecting a direct current (DC) signal with an appropriate magnitude into the wireless transmitter;
coupling a second radio frequency (RF) signal generated by the wireless transmitter at the input of the wireless receiver, wherein the second radio frequency (RF) signal is resultant from the DC signal; and
measuring a magnitude of the coupled first radio frequency (RF) signal at an output of the ADC, wherein the magnitude is measured at the desired frequency; and
adjusting a corner frequency of the filter in response to the determining that the measured magnitude differs from a specified value.

2. The method of claim 1, further comprising, prior to the coupling the first radio frequency (RF) signal, cancelling a DC offset in the wireless receiver.

3. The method of claim 1, further comprising, prior to the coupling first radio frequency (RF) signal, generating the first radio frequency (RF) signal in the wireless transmitter.

4. The method of claim 3, wherein the generating comprises modulating a sine wave having a specified magnitude with an RF signal at the desired frequency.

5. The method of claim 4, wherein the sinusoidal wave has a frequency substantially equal to the corner frequency.

6. The method of claim 1, wherein the coupling the first radio frequency (RF) signal comprises parasitic coupling between signal traces or bond-wires in the wireless transceiver or dedicated coupling between traces in a package or IC substrate containing the wireless transceiver.

7. The method of claim 1, wherein the adjusting comprises:
selecting filter control words or signals to select larger resistor, capacitor, and/or other parameter values in response to a determining that the measured magnitude is less than the specified value; and selecting a filter control word to select smaller resistor, capacitor, and/or other parameter values in response to a determining that the measured magnitude is larger than the specified value.

8. The method of claim 7, wherein the adjusting occurs only if the measured magnitude differs from the specified value by more than a threshold.

9. The method of claim 7, wherein the filter control word or signals are selected from a sorted list of filter control words using a binary search algorithm.

10. The method of claim 1, wherein the method occurs while the wireless receiver and the wireless transmitter are not actively transmitting or receiving signals.

11. A method for tuning an analog baseband filter in a wireless receiver using a wireless transmitter co-located with the wireless receiver, the wireless receiver having an analog-to-digital (ADC) at an output of the analog baseband filter, the method comprising:

cancelling a DC offset in the wireless receiver, wherein the cancelling comprises:
injecting a zero signal into the wireless transmitter;
coupling an first radio frequency (RF) signal generated by the wireless transmitter at the input of the wireless receiver, wherein the first radio frequency (RF) signal is resultant from the zero signal;
measuring a magnitude of a signal at the output of the ADC resulting from the first radio frequency (RF) signal, producing the DC offset; and
applying a digital control word based on the DC offset to a second ADC to cancel the DC offset;
coupling a second radio frequency (RF) signal generated by the wireless transmitter at an input of the wireless receiver, the second radio frequency (RF) signal having a desired frequency;
measuring a magnitude of the coupled second radio frequency (RF) signal at an output of the ADC, wherein the magnitude is measured at the desired frequency; and
adjusting a corner frequency of the filter in response to the determining that the measured magnitude differs from a specified value.

12. The method of claim 11, further comprising, prior to the coupling first radio frequency (RF) signal, generating the second radio frequency (RF) signal in the wireless transmitter.

13. The method of claim 12, wherein the generating comprises modulating a sine wave having a specified magnitude with an RF signal at the desired frequency.

14. The method of claim 13, wherein the sinusoidal wave has a frequency substantially equal to the corner frequency.

15. The method of claim 11, wherein the coupling the first radio frequency (RF) signal comprises parasitic coupling between signal traces or bond-wires in the wireless transceiver or dedicated coupling between traces in a package or IC substrate containing the wireless transceiver.

16. The method of claim 11, wherein the adjusting comprises:

selecting filter control words or signals to select larger resistor, capacitor, and/or other parameter values in response to a determining that the measured magnitude is less than the specified value; and
selecting a filter control word to select smaller resistor, capacitor, and/or other parameter values in response to a determining that the measured magnitude is larger than the specified value.

17. The method of claim 16, wherein the adjusting occurs only if the measured magnitude differs from the specified value by more than a threshold.

18. The method of claim 16, wherein the filter control word or signals are selected from a sorted list of filter control words using a binary search algorithm.

19. The method of claim 11, wherein the method occurs while the wireless receiver and the wireless transmitter are not actively transmitting or receiving signals.

20. The method of claim 11, wherein the analog baseband filter comprises a plurality of analog baseband filters, and the method is repeated for each analog baseband filter in the plurality of analog baseband filters, wherein only an analog baseband filter being tuned is active and all other analog baseband filters are bypassed or deactivated.

21. A method for tuning an analog baseband filter in a wireless receiver using a wireless transmitter co-located with the wireless receiver, the wireless receiver having an analog-to-digital (ADC) at an output of the analog baseband filter, the method comprising:

coupling a radio frequency (RF) signal generated by the wireless transmitter at an input of the wireless receiver, the radio frequency (RF) signal having a desired frequency;
measuring a magnitude of the coupled radio frequency (RF) signal at an output of the ADC, wherein the magnitude is measured at the desired frequency;
adjusting a corner frequency of the filter in response to the determining that the measured magnitude differs from a specified value; and
wherein the analog baseband filter comprises a plurality of analog baseband filters, and the method is repeated for each analog baseband filter in the plurality of analog baseband filters, wherein only an analog baseband filter being tuned is active and all other analog baseband filters are bypassed or deactivated.

22. The method of claim 21, further comprising, prior to the coupling radio frequency (RF) signal, generating the first radio frequency (RF) signal in the wireless transmitter.

23. The method of claim 22, wherein the generating comprises modulating a sine wave having a specified magnitude with an RF signal at the desired frequency.

24. The method of claim 23, wherein the sinusoidal wave has a frequency substantially equal to the corner frequency.

25. The method of claim 22, wherein the adjusting occurs only if the measured magnitude differs from the specified value by more than a threshold.

26. The method of claim 22, wherein the filter control word or signals are selected from a sorted list of filter control words using a binary search algorithm.

27. The method of claim 22, wherein the method occurs while the wireless receiver and the wireless transmitter are not actively transmitting or receiving signals.

28. The method of claim 22, wherein the analog baseband filter comprises a plurality of analog baseband filters, and the method is repeated for each analog baseband filter in the plurality of analog baseband filters, wherein only an analog baseband filter being tuned is active and all other analog baseband filters are bypassed or deactivated.

29. The method of claim 21, wherein the coupling the second radio frequency (RF) signal comprises parasitic coupling between signal traces or bond-wires in the wireless transceiver or dedicated coupling between traces in a package or IC substrate containing the wireless transceiver.

30. The method of claim 21, wherein the adjusting comprises:

selecting filter control words or signals to select larger resistor, capacitor, and/or other parameter values in response to a determining that the measured magnitude is less than the specified value; and selecting a filter control word to select smaller resistor, capacitor, and/or other parameter values in response to a determining that the measured magnitude is larger than the specified value.

31. A transceiver comprising:

a transmitter to generate and transmit radio frequency (RF) signals, and to generate an RF tuning signal having a desired frequency component; and a receiver co-located with the transmitter, the receiver having an analog baseband filter tunable by using a tuning RF signal parasitically coupled from the transmitter, the receiver to receive RF signals from over the air by an antenna, wherein the receiver comprises:

a low noise amplifier coupled to the antenna, the low noise amplifier to amplify a received signal from the antenna and a signal parasitically coupled from the transmitter;

a filter having a tunable corner frequency, the filter coupled to the low noise amplifier, the filter to eliminate signals outside a frequency band of interest, as specified by the tunable corner frequency, from the received RF signals;

an analog-to-digital-converter coupled to the filter, the analog-to-digital-converter configured to digitize an output of the filter;

a detector coupled to the analog-to-digital-converter, the detector configured to compare the digitized output of the filter at the corner frequency with a specified value; and a processor coupled to the detector and to the filter, the processor configured to select a filter control word to tune the corner frequency of the filter if the digitized output of the filter differs from the specified value, wherein the filter comprises:

a low pass filter coupled to the low noise amplifier, the low pass filter to eliminate interferers from the received RF signal, the low pass filter comprising, a mixer coupled to the low noise amplifier and an RF signal source, the mixer to demodulate the coupled signal with a local oscillator signal provided by the RF signal source, the local oscillator signal having a frequency component substantially equal to the desired frequency component, and a capacitor coupled to the mixer; and a second filter coupled to the low pass filter, the second filter to further eliminate interferers from the received RF signal.

32. The transceiver of claim 31, wherein the receiver further comprises a memory to store characterization data of components in the filter.

33. A method for tuning an analog baseband filter in a wireless receiver using a wireless transmitter co-located with the wireless receiver, the wireless receiver having an analog-to-digital (ADC) at an output of the analog baseband filter, the method comprising:

cancelling a DC offset in the wireless receiver;

coupling a first radio frequency (RF) signal generated by the wireless transmitter at an input of the wireless receiver, the first radio frequency (RF) signal having a desired frequency;

measuring a reference value, comprising;

injecting a direct current (DC) signal with an appropriate magnitude into the wireless transmitter;

coupling a second radio frequency (RF) signal generated by the wireless transmitter at the input of the wireless receiver, wherein the second radio frequency (RF) signal is resultant from the DC signal; and measuring a magnitude of the coupled first radio frequency (RF) signal at an output of the ADC, wherein the magnitude is measured at the desired frequency; and adjusting a corner frequency of the filter in response to the determining that the measured magnitude differs from a specified value, wherein the cancelling comprises:

injecting a zero signal into the wireless transmitter;

coupling a third radio frequency (RF) signal generated by the wireless transmitter at the input of the wireless receiver, wherein the third radio frequency (RF) signal is resultant from the zero signal;

measuring a magnitude of a signal at the output of the ADC resulting from the third radio frequency (RF) signal, producing the DC offset; and applying a digital control word based on the DC offset to a second ADC to cancel the DC offset.

* * * * *